United States Patent [19]

Sirazi

[11] Patent Number: 4,527,194
[45] Date of Patent: Jul. 2, 1985

[54] CHANNEL ASSIGNMENT FOR CATV SYSTEM

[75] Inventor: Semir Sirazi, Chicago, Ill.

[73] Assignee: Zenith Electronics Corporation, Glenview, Ill.

[21] Appl. No.: 517,876

[22] Filed: Jul. 27, 1983

[51] Int. Cl.³ .......................... H04N 7/10; H04N 5/50
[52] U.S. Cl. ................................... 358/86; 358/192.1; 455/3; 455/186
[58] Field of Search ...................... 358/86, 191.1, 192.1, 358/195.1; 455/3, 4, 6, 186

[56] References Cited

U.S. PATENT DOCUMENTS

| | | | |
|---|---|---|---|
| 4,279,035 | 7/1981 | Skerlos | 358/192.1 X |
| 4,281,349 | 7/1981 | George | 358/191.1 |
| 4,355,415 | 10/1982 | George et al. | 455/186 X |
| 4,419,769 | 12/1983 | Cohen | 455/186 X |
| 4,425,579 | 1/1984 | Merrell | 358/86 |

*Primary Examiner*—Keith E. George

[57] ABSTRACT

A CATV channel assignment system and method for arranging CATV channels in a tiered fashion facilitates selective viewer access to predetermined groups of CATV channels. A "logical" channel number is generated upon channel selection and is provided to a microcomputer which, in turn, generates a corresponding lock-up PROM address. The logical channel number is converted by means of the thus generated address to a "physical" channel number in the PROM. The physical channel number represents a standard CATV channel and is provided to the microcomputer for synthesizing the correct tuning frequency via a phase lock loop and conventional tuning circuitry. For a two cable system automatic cable switching is provided to permit channels on either cable to be included within the same group of selected channels. The present invention facilitates the "tiering" of CATV channels into predetermined groups of channels, wherein each group has a viewer access authorization level associated therewith, and in which all channels in a group may be assigned logically related channel numbers, e.g., consecutively arranged channel numbers, while the corresponding standard channel numbers may be widely disparate and unrelated in a given group. This arrangement facilitates viewer channel selection by organizing subscribed-to channels into easily remembered numerical sequences and simplifies selective accessing of CATV channels by arranging these channels into two or more tiers where the channel numbers in each tier are logically related and not randomly assigned.

11 Claims, 3 Drawing Figures

CHANNEL ASSIGNMENT FOR CATV SYSTEM

BACKGROUND OF THE INVENTION

This invention relates generally to CATV systems and is particularly directed to a system for assigning preferred channel numbers to standard CATV channels to facilitate channel assignment into predetermined groups for improved authorized channel number selection.

Increases in the number and variety of programs available to CATV viewers has been dramatic and promises to continue at a steady rate of growth. Indeed, cable compatible television receivers are available which provide the capability to tune to well in excess of 100 CATV channels. CATV channel selection has, as a result, become more complicated for the viewer with the vastly increased number of available CATV channels.

Further complicating channel selection for the CATV viewer is the grouping of channels into tiers where the viewer subscribes to the viewing of selected tiers of channels as desired. This tiered organization of CATV channels is generally based upon program content and the viewer may typically subscribe to one or more groups. Since the CATV channels are generally organized, or grouped, on the basis of program content, channels within a particular group may possess widely varying channel numbers. The viewer is thus required to either memorize a series of unrelated and widely disparate numbers or to refer to a look-up table during channel selection. This, of course, is an inconvenience for the CATV viewer and will become increasingly so as the number of available CATV channels increases.

In addition, the number of available CATV channels has increased to the point where frequently, for signal handling purposes, more than one cable is required for handling all of the channels. Thus, the viewer must not only remember the number of a desired CATV channel, but must also remember on which cable that channel is being received for cable switching purposes during the channel selection process. The situation becomes even more complicated when the channels are organized in a tiered arrangement and channels included within a particular group are received on more than one cable. The viewer then must not only remember widely disparate and logically unrelated channel numbers, but also must remember which of several cables must be switched to for reception of a desired CATV channel.

The present invention simplifies the complicated process of CATV channel selection by providing a system and method for arranging CATV channels in groups in which the channel numbers may be assigned in a logical sequence to facilitate viewer channel number selection where the carrier frequencies of the channels within that group may be widely separated. The present invention further facilitates CATV program tiering and selective viewer authorization for predetermined CATV channels. In addition, the present invention provides for automatic cable switching upon channel number selection to accommodate a multi-cable system.

OBJECTS OF THE INVENTION

Accordingly, it is an object of the present invention to provide an improved arrangement for selecting and tuning to CATV channels.

It is another object of the present invention to facilitate arranging CATV channels into selected groups of channels in limiting viewer access to CATV programming on the basis of a tiered channel organization.

Yet another object of the present invention is to group CATV channel numbers on the basis of a logical relationship among channel numbers in a given group to facilitate viewer channel number recall and selection.

A further object of the present invention is to provide for automatic cable switching upon channel selection in a multi-cable CATV system thus making CATV channel selection transparent to the viewer.

A still further object of the present invention is to provide a CATV tuning system wherein tuning frequencies may be assigned channel numbers as desired to facilitate CATV channel assignment.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
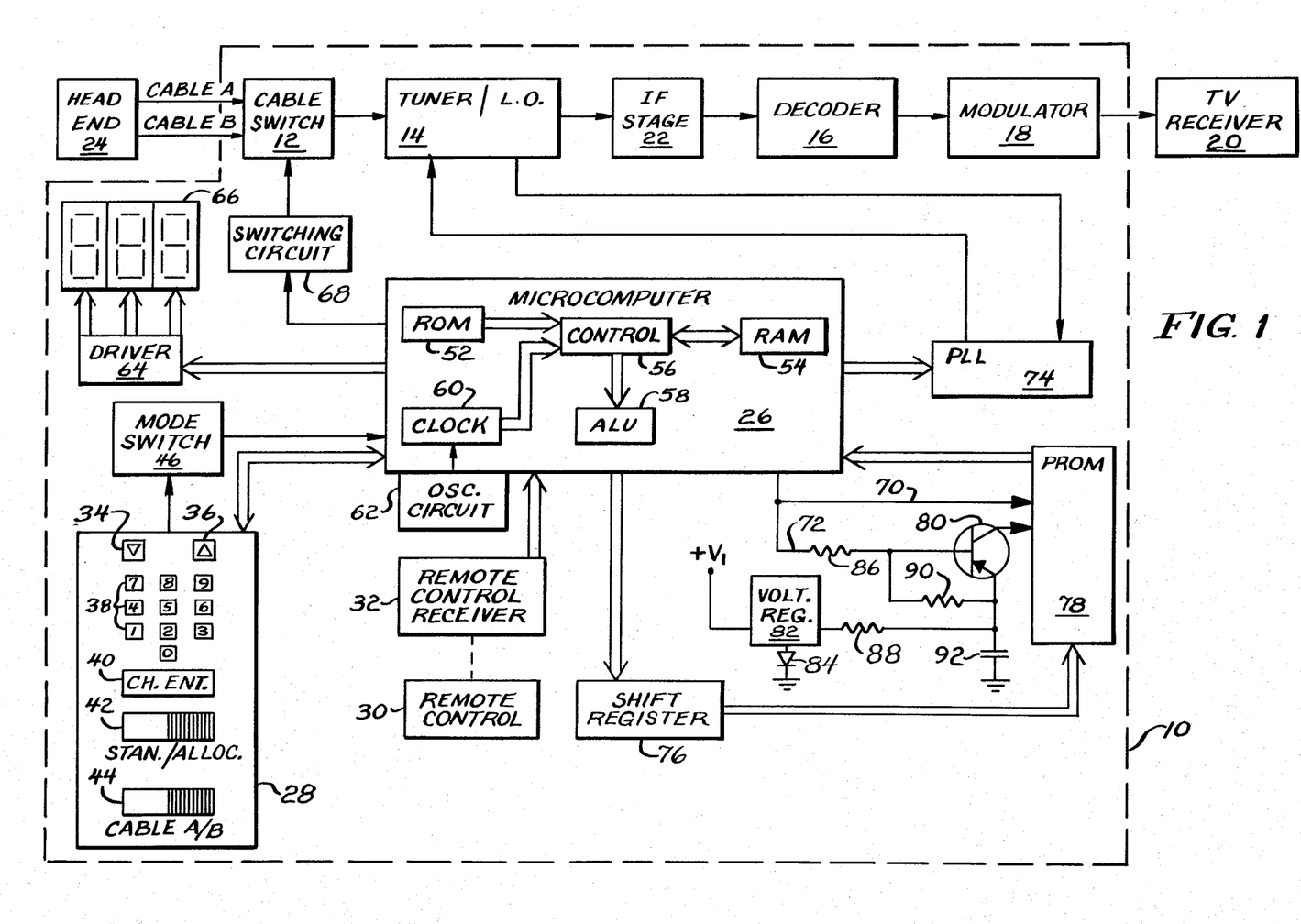
FIG. 1 which is partially in block diagram form and partially in schematic diagram form shows a CATV channel assignment system in accordance with the present invention.

Referring to FIG. 1, there is shown in block and schematic diagram form a CATV channel assignment system 10 in accordance with the present invention. Channel selection is made by keyboard 28 or by remote control 30 entry. Digit keys, or touch pads, 38 on the front panel of the keyboard 28 and on the remote controller 30 (not shown) provide direct entry of the desired channel number digits to the microcomputer 26 or channel selection may be made by means of a channel scanning process using channel UP or DOWN selectors 36, 34. When the desired channel number is entered the following events occur: (1) a microcomputer 26 output signal to a light emitting diode (LED) driver/decoder 64 activates the proper segments of a seven segment, three digit LED display 66 in displaying the selected channel number; (2) the microcomputer 26 initially compares the channel number selected with a crossover channel number read from an external PROM 78 and stored during the initialization process in its RAM 54 which represents the first channel number of a second cable to which the channel assignment system is coupled; (3) the microcomputer 26 activates a programmable read only memory (PROM) device 78 which includes a look-up table containing a plurality of physical channel numbers representing the tuning frequency of various CATV channels and cable A/B designation; and (4) the microcomputer then generates a memory pointer for accessing a predetermined physical channel number in the PROM, reads the physical channel number and cable designation from the PROM, and generates an appropriate switching signal which it provides via switching circuit 68 to a cable switch circuit 12 for switching to either cable A or cable B, and then via another fixed look-up table internal to the microcomputer, it loads the tuning frequency corresponding to the physical channel number into a phase-locked loop (PLL) 74 which, in turn, provides the proper control input to the tuner/local oscillator 14 for tuning to the desired CATV channel.

The CATV channel assignment system 10 of the present invention also includes a decoder 16 for decoding the received CATV signal and a modulator 18 for modulating the received and decoded CATV signal on a predetermined channel, such as channel 3. The thus modulated signal is then provided to a conventional television receiver 20 for viewing. The CATV channel assignment system 10 is coupled to the head end 24 of a CATV distribution system from which CATV programming and various viewer control signals may be received.

Channel numbers are entered in the CATV channel assignment system 10 by means of either keyboard 28 or remote controller 30. Remote controller 30 generates electromagnetic waves typically in the infrared (IR) spectrum which are transmitted to and received by a remote control receiver 32 which, in turn, provides binary coded remote control signals to microcomputer 26. Channel numbers may be entered by means of keyboard 28 using two alternate procedures. One procedure involves the use of either channel UP or DOWN selectors 36, 34. Selection of the channel DOWN selector 34 permits the CATV channel assignment system 10 to sequence in a downward direction through all CATV channels which it is authorized to receive. Similarly, selection of the channel UP selector 36 permits the CATV channel assignment system 10 to sequence in an upward direction through all authorized CATV channels. Microcomputer 26 generates scanning signals which are provided to keyboard 28 for detecting engaged keys thereon. Since the present invention is not concerned with the manner in which program authorization is provided for selective viewing of CATV channels, the coding and decoding of the received CATV channel signal is not discussed herein.

The other method for channel number selection involves the sequential selection of one or more of the digit keys 38 followed by viewer selection of a CHANNEL ENTER control 40. This results in binary signals representing the selected channel number being provided to microcomputer 26 for processing therein. A mode selection capability such as a standard/allocatable mode and single/dual cable selection is provided by a standard/allocatable channel mode selector 42 and a cable A/B selector 44, respectively. In the dual cable mode, the present invention also provides for an automatic cable selection capability. The standard mode of operation represents normal channel tuning wherein the CATV channel assignment system 10 tunes to the "physical" channel number entered via either keyboard 28 or remote controller 30. As used herein, "physical" channel number represents a selected channel having a standard CATV carrier frequency while the term "logical" channel number means a selected channel having a carrier frequency assigned to another, standard CATV channel. In the frequency-allocatable channel mode of operation the channel number entered via keyboard 28 or remote controller 30 represents a "logical" channel number for purposes of CATV channel assignment, which logical channel number is converted by means of microcomputer 26 and PROM 78 to a physical channel number representing the carrier frequency of the selected CATV channel. The manner in which this channel number translation is carried out is described in detail below.

Microcomputer 26 is a 4-bit E/D MOS integrated circuit with a ROM 52, a RAM 54, a controller 56, an arithmetic logic unit (ALU) 58, and a clock generator 60 on a single semiconductor chip. In one embodiment, microcomputer 26 may be incorporated in a single integrated circuit (IC) with a phase locked loop (PLL) 74. Microcomputer 26 stores data, periodically updates this stored data, compares both stored and real time data and makes decisions based upon these comparisons in providing CATV channel assignment system control. The microcomputer chip used in a preferred embodiment of the present invention is the MN 1414 integrated circuit as manufactured by the Matsushita Electronics Corporation. The RAM 54 of microcomputer 26 has an X-register, Y-register matrix memory organization with a capacity of 64 by 4 bits with each word stored in a memory storage point consisting of 4 bits. For example, the selection of a particular channel number by means of either channel UP or DOWN selectors 36, 34 or digit keys 38 in combination with CHANNEL ENTER control 40 will cause a corresponding address in look-up PROM 78 to be accessed via shift register 76. Microcomputer chip timing is provided by means of an oscillator circuit 62 coupled to microcomputer 26 which generates the signals necessary to perform a given operation. A clock generator 60 is driven by the oscillator circuit 62, portions of which are located internal to and external to the microcomputer chip 26. More detailed information regarding the microcomputer chip configuration and operation is contained in the Matsushita Electronics Corporation publication entitled "MN 1400 Series: 4-Bit 1-Chip Microcomputers". While the present invention is disclosed in terms of a particular microcomputer chip, it will be apparent to those skilled in the art that the present invention could as easily be implemented with any number of commercially available, off-the-shelf microcomputers having similar interface and operating characteristics.

Indirect frequency synthesis is used in the CATV channel assignment system 10 in which a phase locked loop (PLL) 74 utilizes the tuner/local oscillator 14 as its voltage controlled oscillator (VCO). PLL 74 includes a reference crystal oscillator (not shown), the output of which is compared with a divided down local oscillator signal for providing a correction signal to the tuner/local oscillator 14 when these two signals differ in frequency. When there is a difference in these two frequencies, the correction voltage output provided by PLL 74 to the tuner/local oscillator 14 effects a change in the local oscillator frequency until the two signals have exactly the same frequency. The tuner/local oscillator 14 then assumes the stability of the crystal reference oscillator. This operation is performed by providing appropriate physical channel number tuning information from microcomputer 26 to PLL 74 in a manner described below. The local oscillator frequency is then mixed in the tuner/local oscillator 14 with the received RF CATV signal from the cable switch 12 to generate an IF signal. The IF signal is coupled to an IF stage 22 where it is processed and detected and then decoded in a decoder 16, the output of which is modulated on a predetermined channel by means of modulator 18.

The selection of a particular channel number by means of either channel UP or DOWN selectors 36, 34 or the combination of digit keys 38 and CHANNEL ENTER control 40 causes the appropriate look-up PROM 78 address to be accessed in accordance with a control program stored in ROM 52 as executed by the microcomputer controller 56 and the contents of the addressed RAM storage location to be read therefrom and provided to PROM 78 via shift register 76. Information stored in the microcomputer's RAM 54 represents a "logical" channel number, or the actual digits selected and displayed on LED display 66. In response to the selection of a channel number, two adjacent locations are addressed in the microcomputer's RAM 54 so as to generate an address in look-up PROM 78. This PROM address is represented by two nibbles, each comprised of 4 bits. The least significant three bits of the first nibble represents the most significant digit of a physical channel number and the second nibble represents the least significant digit of the physical channel number. The most significant bit of the first nibble represents cable A/B designation. For example, if channel 4 is entered through keyboard 28 or the remote controller 30, the memory address locations for this channel number in PROM 78 will be "06" and "07" in hexadecimal format. Again, the physical channel number, frequency wise, is referred to as the standard channel number. The relationship between the logical and physical channel numbers for the aforementioned example is shown in Table I.

TABLE I

Logical Channel Number 4 { "06" [0 0 0 1] ← 1 ; "07" [0 1 1 1] ← 7 } Physical Channel Number 17.

The carrier frequency for channel 17 is 138 MHz in a harmonically related carrier (HRC) mode of operation available in CATV systems. The physical channel assignments of video carrier frequencies are shown in Table II. Also shown in Table II are various offset video carrier frequencies and intermediate related video carrier frequencies representing other modes of operation typically available in CATV systems. In the present example, LED display 66 will show channel 4, but the CATV channel assignment system 10 under the control of microcomputer 26 will tune to physical, or standard, channel 17. The physical channel number is stored in PROM 78 in binary coded decimal (BCD) format as shown in Table III. A binary signal representing the physical channel number to which the logical channel number is assigned in accordance with the contents of RAM 54 is provided to PROM 78 via a shift register 76. Shift register 76 serially shifts the bits in each nibble of the look-up table address into PROM 78 in addressing the memory location in which is stored the desired physical channel number. Shift register 76 is required because of the limited number of output pins of microcomputer 26 which is thus unable to load PROM 78 with the look-up table address in parallel. Thus, shift register 76 would not be required where the interface characteristics of microcomputer 26 and PROM 78 permitted the parallel loading of the look-up table address into PROM 78. Once the PROM address is written by microcomputer 26 to PROM 78, the microcomputer 26 turns on PROM 78 by providing a chip select input via line 70 and a power up initiation signal via line 72.

A $+V_1$ supply is coupled via voltage regulator 82 to the emitter of PNP transistor 80. In a preferred embodiment $V_1 = +12$ VDC, while block 82 represents a conventional 5 volt regulator circuit. Diode 84 couples voltage regulator 82 to neutral ground potential, while the combination of resistor 88 and grounded capacitor 92 filters the DC input provided to the emitter of PNP transistor 80. The base of transistor 80 is maintained in a high state and is brought low when a power up signal is provided via line 72 from microcomputer 26. This renders PNP transistor 80 conductive which supplies current from the $+V_1$ power supply to PROM 78 for the activation thereof. Resistor 90 provides proper biasing for transistor 80 while resistor 86 performs a current limiting function with respect to transistor 80.

Once PROM 78 is energized, microcomputer 26 then reads the first nibble, or 4 bits, of the physical channel number from a designated address in PROM 78 as determined from Table III. After these 4 bits are read from PROM 78, microcomputer 26 then increments this PROM address by 1 and reads the contents of the next location in PROM 78 which corresponds to the least significant digit of the physical channel number. The microcomputer 26 then converts the physical channel number thus read from PROM 78 into a tuning frequency word in accordance with Table II, which tuning frequency word is then provided to PLL 74 for providing a frequency control signal to local oscillator 14 in generating the proper IF signal for tuning to the selected CATV channel.

TABLE II

| | | CHANNEL ASSIGNMENTS OF VIDEO CARRIER FREQUENCIES | | | |
|---|---|---|---|---|---|
| CHANNEL SELECT | CHANNEL NUMBER | STANDARD VIDEO CARRIER FREQ. IN MHz | OFFSET VIDEO CARRIER FREQ. IN MHz | HRC VIDEO CARRIER FREQ. IN MHz | IRC VIDEO CARRIER FREQ. IN MHz |
| 74 | 4.5 | — | — | 72.00 | 73.25 |
| 0 | A-2 | 109.25 | 109.25 | 108.00 | 109.25 |
| 1 | A-1 | 115.25 | 115.25 | 114.00 | 115.25 |
| 2 | 2 | 55.25 | 55.25 | 54.00 | 55.25 |
| 3 | 3 | 61.25 | 61.25 | 60.00 | 61.25 |
| 4 | 4 | 67.25 | 67.25 | 66.00 | 67.25 |
| 5 | 5 | 77.25 | 77.25 | 78.00 | 79.25 |
| 6 | 6 | 83.25 | 83.25 | 84.00 | 85.25 |
| 7 | 7 | 175.25 | 175.25 | 174.00 | 175.25 |
| 8 | 8 | 181.25 | 181.25 | 180.00 | 181.25 |
| 9 | 9 | 187.25 | 187.25 | 186.00 | 187.25 |
| 10 | 10 | 193.25 | 193.25 | 192.00 | 193.25 |
| 11 | 11 | 199.25 | 199.25 | 198.00 | 199.25 |

TABLE II-continued

| CHANNEL ASSIGNMENTS OF VIDEO CARRIER FREQUENCIES | | | | | |
|---|---|---|---|---|---|
| CHANNEL SELECT | CHANNEL NUMBER | STANDARD VIDEO CARRIER FREQ. IN MHz | OFFSET VIDEO CARRIER FREQ. IN MHz | HRC VIDEO CARRIER FREQ. IN MHz | IRC VIDEO CARRIER FREQ. IN MHz |
| 12 | 12 | 205.25 | 205.25 | 204.00 | 205.25 |
| 13 | 13 | 211.25 | 211.25 | 210.00 | 211.25 |
| 14 | A | 121.25 | 121.25 | 120.00 | 121.25 |
| 15 | B | 127.25 | 127.25 | 126.00 | 127.25 |
| 16 | C | 133.25 | 133.25 | 132.00 | 133.25 |
| 17 | D | 139.25 | 139.25 | 138.00 | 139.25 |
| 18 | E | 145.25 | 145.25 | 144.00 | 145.25 |
| 19 | F | 151.25 | 151.25 | 150.00 | 151.25 |
| 20 | G | 157.25 | 157.25 | 156.00 | 157.25 |
| 21 | H | 163.25 | 163.25 | 162.00 | 163.25 |
| 22 | I | 169.25 | 169.25 | 168.00 | 169.25 |
| 23 | J | 217.25 | 217.25 | 216.00 | 217.25 |
| 24 | K | 223.25 | 222.25 | 222.00 | 223.25 |
| 25 | L | 229.25 | 228.25 | 228.00 | 229.25 |
| 26 | M | 235.25 | 234.25 | 234.00 | 235.25 |
| 27 | N | 241.25 | 240.25 | 240.00 | 241.25 |
| 28 | O | 247.25 | 246.25 | 246.00 | 247.25 |
| 29 | P | 253.25 | 252.25 | 252.00 | 253.25 |
| 30 | Q | 259.25 | 258.25 | 258.00 | 259.25 |
| 31 | R | 265.25 | 264.25 | 264.00 | 265.25 |
| 32 | S | 271.25 | 270.25 | 270.00 | 271.25 |
| 33 | T | 277.25 | 276.25 | 276.00 | 277.25 |
| 34 | U | 283.25 | 282.25 | 282.00 | 283.25 |
| 35 | V | 289.25 | 288.25 | 288.00 | 289.25 |
| 36 | W | 295.25 | 294.25 −1MHz Offset From Standard Video | 294.00 | 295.25 |
| 37 | XA | 301.25 | 301.25 | 300.00 | 301.25 |
| 38 | YB | 307.25 | 307.25 | 306.00 | 307.25 |
| 39 | ZC | 313.25 | 313.25 | 312.00 | 313.25 |
| 40 | M1D | 319.25 | 319.25 | 318.00 | 319.25 |
| 41 | M2E | 325.25 | 325.25 | 324.00 | 325.25 |
| 42 | M3F | 331.25 | 331.25 | 330.00 | 331.25 |
| 43 | M4G | 337.25 | 337.25 | 336.00 | 337.25 |
| 44 | M5H | 343.25 | 343.25 | 342.00 | 343.25 |
| 45 | M6I | 349.25 | 349.25 | 348.00 | 349.25 |
| 46 | M7J | 355.25 | 355.25 | 354.00 | 355.25 |
| 47 | M8K | 361.25 | 361.25 | 360.00 | 361.25 |
| 48 | M9L | 367.25 | 367.25 | 366.00 | 367.25 |
| 49 | M10M | 373.25 | 373.25 | 372.00 | 373.25 |
| 50 | M11N | 379.25 | 379.25 | 378.00 | 379.25 |
| 51 | M12O | 385.25 | 385.25 | 384.00 | 385.25 |
| 52 | M13P | 391.25 | 391.25 | 390.00 | 391.25 |
| 53 | M14Q | 397.25 | 397.25 | 396.00 | 397.25 |
| 54 | M15 | 403.25 | 403.25 | 402.00 | 403.25 |
| 55 | M16 | 409.25 | 409.25 | 408.00 | 409.25 |
| 56 | M17 | 415.25 | 415.25 | 414.00 | 415.25 |
| 57 | M18 | 421.25 | 421.25 | 420.00 | 421.25 |
| 58 | M19 | 427.25 | 427.25 | 426.00 | 427.25 |
| 59 | M20 | 433.25 | 433.25 | 432.00 | 433.25 |
| 60 | M21 | 439.25 | 439.25 | 438.00 | 439.25 |
| 61 | M22 | 445.25 | 445.25 | 444.00 | 445.25 |
| 62 | — | — | — | | |
| 63 | — | — | — | | |
| 64 | — | — | — | | |
| 65 | — | — | — | | |
| 66 | — | — | — | | |
| 67 | — | — | — | | |
| 68 | — | — | — | | |
| 69 | — | — | — | | |
| 70 | — | — | — | | |
| 71 | 6 + 1 | 89.25 | 89.25 | 90.00 | 91.25 |
| 72 | 6 + 2 | 95.25 | 95.25 | 96.00 | 97.25 |
| 73 | 6 + 3 | 101.25 | 101.25 | 102.00 | 103.25 |

TABLE III

CHANNEL ASSIGNMENT PROM

| ENTERED CHANNEL # | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| PROM ADDRESS | 00 | 02 | 04 | 06 | 08 | 0A | 0C | 0E | 10 | 12 | 14 | 16 | 18 | 1A | 1C | 1E | 20 | 22 | 24 | 26 |
|  | 01 | 03 | 05 | 07 | 09 | 0B | 0D | 0F | 11 | 13 | 15 | 17 | 19 | 1B | 1D | 1F | 21 | 23 | 25 | 27 |
| PROM CONTENT | 0 | 0 | 0 | 0 | 0 | 0 | 0 | – | – | – | – | – | – | – | 2 | 2 | 2 | 2 | – | – |
|  | 2 | 3 | 4 | 5 | 6 | 0 | 1 | 4 | 5 | 6 | 7 | 8 | 9 | – | 0 | 1 | 0 | 7 | 0 | 0 |

| ENTERED CHANNEL # | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|
| PROM ADDRESS | 28 | 2A | 2C | 2E | 30 | 32 | 34 | 36 | 38 | 3A | 3C | 3E | 40 | 42 | 44 | 46 | 48 | 4A | 4C | 4E |
|  | 29 | 2B | 2D | 2F | 31 | 33 | 35 | 37 | 39 | 3B | 3D | 3F | 41 | 43 | 45 | 47 | 49 | 4B | 4D | 4F |
| PROM CONTENT | 8 | 8 | 8 | 8 | 8 | 8 | 8 | 8 | 8 | 8 | 8 | 8 | 9 | 9 | 9 | 9 | 9 | 9 | 9 | 9 |
|  | – | – | – | – | 5 | 6 | 7 | 8 | 9 | 0 | 1 | 2 | 3 | 4 | 5 | 6 | 7 | 8 | 9 | 0 |

| ENTERED CHANNEL # | 41 | 42 | 43 | 44 | 45 | 46 | 47 | 48 | 49 | 50 | 51 | 52 | 53 | 54 | 55 | 56 | 57 | 58 | 59 | 60 |
|---|---|---|---|---|---|---|---|---|---|---|---|---|---|---|---|---|---|---|---|---|
| PROM ADDRESS | 50 | 52 | 54 | 56 | 58 | 5A | 5C | 5E | 60 | 62 | 64 | 66 | 68 | 6A | 6C | 6E | 70 | 72 | 74 | 76 |
|  | 51 | 53 | 55 | 57 | 59 | 5B | 5D | 5F | 61 | 63 | 65 | 67 | 69 | 6B | 6D | 6F | 71 | 73 | 75 | 77 |
| PROM CONTENT | 3 | 3 | 3 | 3 | 3 | 3 | 3 | 2 | 8 | 8 | – | – | 5 | 5 | 5 | 5 | 5 | 5 | 5 | 5 |
|  | 1 | 2 | 3 | 4 | 5 | 6 | 7 | 8 | 9 | 4 | – | – | 2 | 3 | 4 | 5 | 6 | 7 | 8 | 9 |

| ENTERED CHANNEL # | 61 | 62 | 63 | 64 | 65 | 66 | 67 | 68 | 69 | 70 | 71 | 72 | 73 | 74 | 75 | 76 | 77 | 78 | 79 | 80 |
|---|---|---|---|---|---|---|---|---|---|---|---|---|---|---|---|---|---|---|---|---|
| PROM ADDRESS | 78 | 7A | 7C | 7E | 80 | 82 | 84 | 86 | 88 | 8A | 8C | 8E | 90 | 92 | 94 | 96 | 98 | 9A | 9C | 9E |
|  | 79 | 7B | 7D | 7F | 81 | 83 | 85 | 87 | 89 | 8B | 8D | 8F | 91 | 93 | 95 | 97 | 99 | 9B | 9D | 9F |
| PROM CONTENT | 4 | 4 | 4 | 4 | 6 | 6 | 6 | – | – | – | – | – | – | 2 | 4 | 5 | 6 | 7 | 8 | 9 |
|  | 6 | 7 | 8 | 9 | 5 | 6 | 7 | – | – | – | – | – | 9 | – | – | 5 | 5 | 5 | 5 | 5 |

| ENTERED CHANNEL # | 81 | 82 | 83 | 84 | 85 | 86 | 87 | 88 | 89 | 90 | 91 | 92 | 93 | 94 | 95 | 96 | 97 | 98 | 99 | 100 |
|---|---|---|---|---|---|---|---|---|---|---|---|---|---|---|---|---|---|---|---|---|
| PROM ADDRESS | A0 | A2 | A4 | A6 | A8 | AA | AC | AE | B0 | B2 | B4 | B6 | B8 | BA | BC | BE | C0 | C2 | C4 | C6 |
|  | A1 | A3 | A5 | A7 | A9 | AB | AD | AF | B1 | B3 | B5 | B7 | B9 | BB | BD | BF | C1 | C3 | C5 | C7 |
| PROM CONTENT | – | – | – | – | – | – | – | – | – | – | – | – | – | – | – | – | – | – | – | – |
|  | 3 | 3 | 3 | 3 | 2 | 3 | 2 | 2 | 5 | 8 | 0 | 8 | 2 | 4 | 1 | 2 | 3 | 3 | 3 | 3 |

| ENTERED CHANNEL # | 101 | 102 | 103 | 104 | 105 | 106 | 107 | 108 | 109 | 110 | 111 | 112 | 113 | 114 | 115 | 116 | 117 | 118 | 119 | 120 |
|---|---|---|---|---|---|---|---|---|---|---|---|---|---|---|---|---|---|---|---|---|
| PROM ADDRESS | C8 | CA | CC | CE | D0 | D2 | D4 | D6 | D8 | DA | DC | DE | E0 | E2 | E4 | E6 | E8 | EA | EC | EE |
|  | C9 | CB | CD | CF | D1 | D3 | D5 | D7 | D9 | DB | DD | DF | E1 | E3 | E5 | E7 | E9 | EB | ED | EF |
| PROM CONTENT | 4 | 4 | 4 | 4 | 4 | 4 | 4 | – | – | – | – | – | – | – | – | – | – | – | – | – |
|  | 0 | 1 | 2 | 3 | 4 | 5 | 6 | 7 | 8 | 9 | 0 | 1 | 2 | 3 | 4 | 5 | 6 | 7 | 8 | 9 |

CABLE CROSSOVER

| PROM ADDRESS | FC | FE |
|---|---|---|
|  | FD | FF |
| PROM CONTENT | 6 | |
|  | 1 | |

*PROM CONTENT IN BCD FORMAT

Referring back to Table I, there is shown the relationship between the logical channel number 4 and the physical channel number 17 which is shown in hexadecimal format where the upper row represents the most significant digit and the lower row represents the least significant digit of the physical channel number. The first bit of the upper row of the physical channel number is used to designate the cable on which the selected channel number is to be received. For example, when the first bit of the most significant digit of the physical channel number is 0, cable A is selected. On the other hand, when the first bit of the most significant digit of the physical channel number is 1, cable B is selected as described below with respect to FIGS. 1 and 2.

Figure 2:
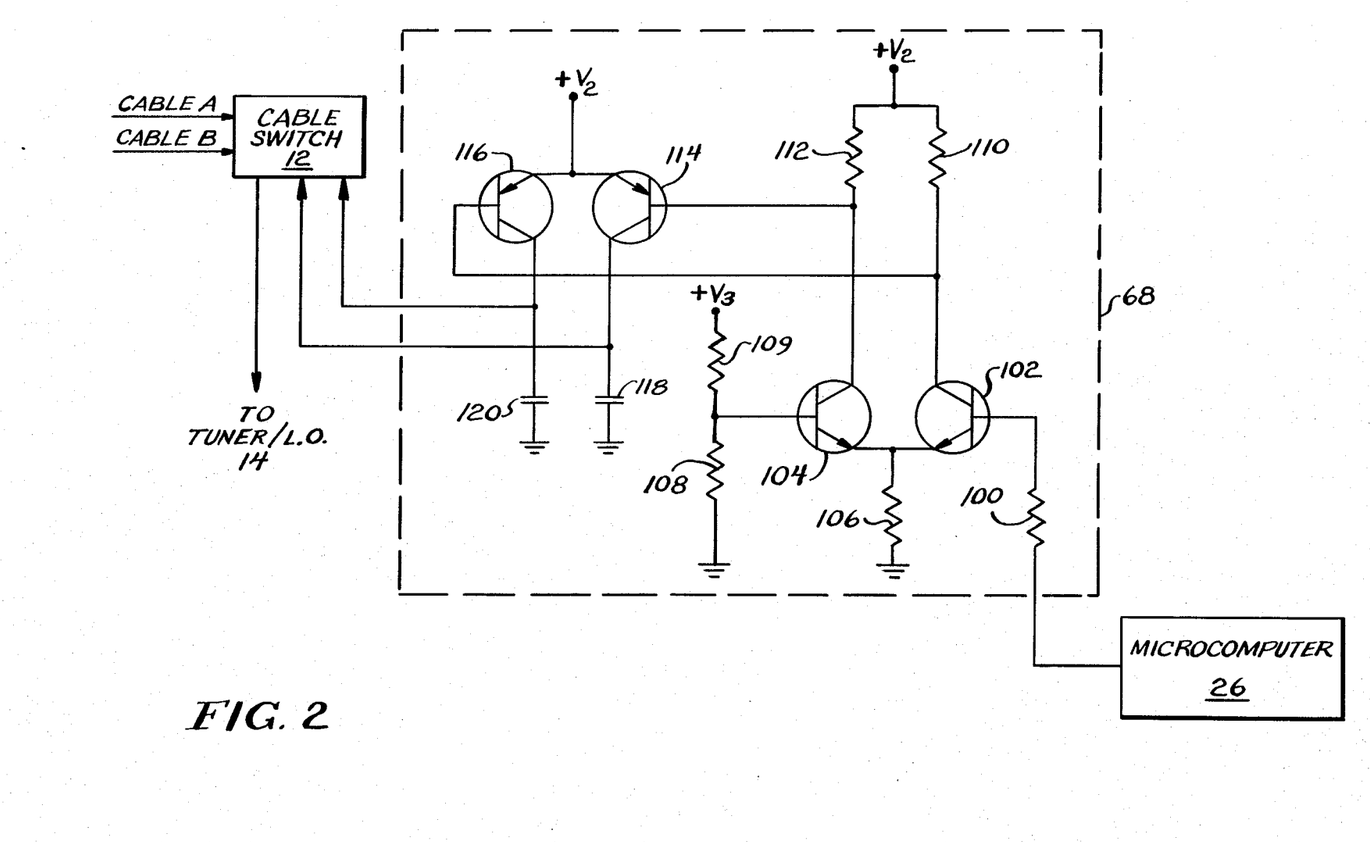
FIG. 2 which also is in block and schematic diagram form shows the details of a cable switching circuit for use in the CATV channel assignment system of FIG. 1 for automatically switching from one cable to another upon channel number entry.

Following receipt of the physical channel number from PROM 78 by microcomputer 26, microcomputer 26 provides a control signal to switching circuit 68 as determined by the first bit of the most significant digit of the physical channel number. The details of switching circuit 68 are shown in FIG. 2.

With the first bit of the most significant digit of the physical channel number equal to 1, microcomputer 26 outputs a signal to the base of NPN transistor 102 via resistor 100. With a $+V_2$ voltage applied across transistor 102, it is rendered conductive by means of the output from microcomputer 26. With transistor 102 conducting, PNP transistor 116 is also rendered conductive and provides an output via its collector to a cable switch circuit 12. Cable switch 12, which is coupled to cables A and B, may be any conventional switching circuit and could, for example, be implemented with a switching diode. In response to an output from PNP transistor 116, cable switch circuit 12 couples the input from cable A to the tuner/local oscillator circuit 14. Similarly, when microcomputer 26 does not provide an output to NPN transistor 102, NPN transistor 104 is rendered conductive and, in turn, turns on PNP transistor 114 for providing a cable B control input to cable switch circuit 12 for coupling cable B to the tuner/local oscillator 14. Resistors 110, 112 coupled between the $+V_2$ voltage source and the collectors of transistors 102, 104 provide proper biasing therefor. A $+V_3$ voltage source is coupled to the base of transistor 104 via a voltage dividing network comprised of resistors 108, 109. Resistor 106 isolates the emitters of transistors 102, 104 from neutral ground potential. A $+V_2$ voltage source is coupled across transistors 114, 116 with capacitors 118, 120 respectively coupled thereto providing DC decoupling therefor.

The contents of PROM 78 may be programmed prior to incorporation in the present system or may be modified as desired by appropriate control signals from the cable system's head end 24 in a cable system. These control signals could be provided during the vertical blanking interval (VBI) in a conventional manner and could be processed in microcomputer 26 for changing the channel assignment arrangement and tiering organization stored in PROM 78. Memory devices such as a static or dynamic random access memory, an ultraviolet-light erasable programmable read only memory, or an electrically erasable programmable read only memory could be utilized in such an application.

The manner in which digital signals are processed in the CATV channel assignment system 10 in arranging channels in a tiered manner will now be explained with reference to the flow chart shown in FIG. 3. In referring to FIG. 3, an oval symbol indicates the start of an operational sequence, a rectangle indicates an instruction or set of instructions resulting in the performance of a control function, and a diamond indicates a decision point based upon the comparison of binary signal inputs.

POWER ON

Figure 3:
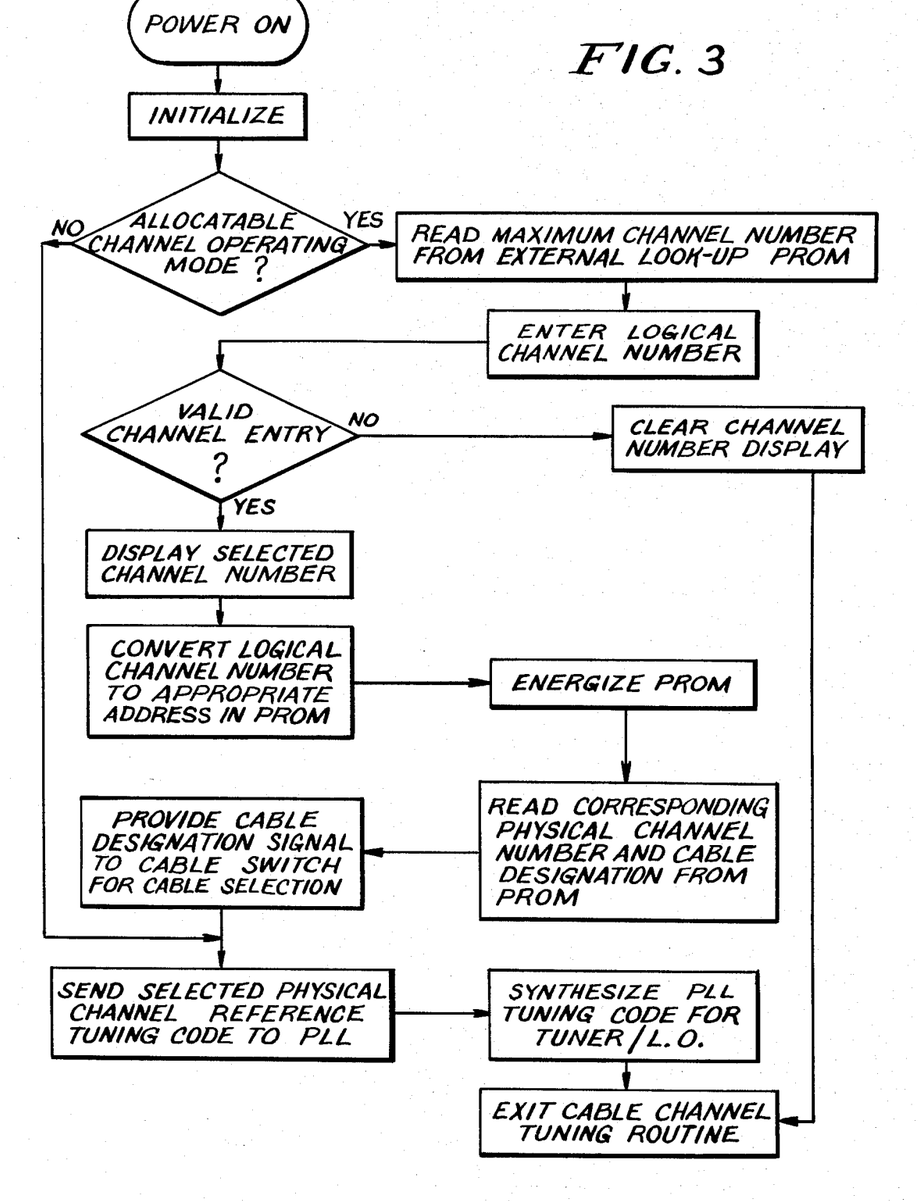
FIG. 3 is a flow chart illustrating the operation of the CATV channel assignment system shown in FIG. 1 under the control of a microcomputer.

As indicated in FIG. 3, power must be applied to the CATV channel assignment system before channel selection in accordance with the channel assignment arrangement of the present invention may be initiated. The microcomputer's ROM 52, possessing a nonvolatile memory, retains stored data without power applied to the CATV channel assignment system. The microcomputer's RAM 54, possessing a volatile memory, loses stored data when power is removed from the system with the result that data must again be stored in the RAM 54 when power is again applied to the CATV channel assignment system. PROM 78 is also a nonvolatile memory device and retains information stored therein when power is removed from the system.

INITIALIZE

Microcomputer 26 turns itself on when power is applied to the CATV channel assignment system. Thereafter memory storage locations in RAM 54 and other portions of microcomputer 26 are initialized to predetermined conditions established by outputs from ROM 52. Data transferred from ROM 52 to RAM 54 includes program operating instructions and constants, e.g., tuning data, keyboard scanning data, etc. Instructions output by ROM 52 are decoded by the microcomputer's controller 56 before being transmitted to the various microcomputer control elements. Control logic in the form of the microcomputer's arithmetic logic unit (ALU) 58 then implements these instructions.

DETERMINE SYSTEM OPERATING MODE

The program stored in the microcomputer's ROM 52 then determines whether the CATV channel assignment system is in the STANDARD or CHANNEL ALLOCATABLE mode of operation depending upon the position of the standard/allocatable channel mode selector switch 42. The position of this switch is monitored and detected by the scanning of the keyboard 28 by microcomputer 26 in a conventional manner. If it is determined that the mode selector switch 42 is in the CHANNEL ALLOCATABLE mode of operation, the program then proceeds to the next step in the channel assignment tuning routine. If it is determined that the mode selector switch is in the STANDARD operating mode position, the program can only execute standard channel tuning routines. In the CHANNEL ALLOCATABLE mode of operation, the maximum channel number per cable is read from the look-up PROM which contains physical channel numbers, cable A/B designation and maximum channel number per cable information. To determine the maximum channel number stored in the highest two address locations of the PROM, the look-up PROM is read in the same manner as described above and this maximum channel number is stored in RAM 54.

ENTER LOGICAL CHANNEL NUMBER

The program then determines whether a logical channel number has been entered either by means of keyboard 28 or remote control unit 30. The microcomputer 26 detects digit entries on keyboard 28 by scanning the matrix of digit keys 38 and detecting key engagement signals provided back to microcomputer 26.

Channel number entries via remote controller 30 are detected by the remote control receiver 32 with coded outputs representing the selected channel number then provided to microcomputer 26 for processing therein.

VALID CHANNEL ENTRY?

The program then determines whether an entered logical channel number is valid. Once a channel number is entered and CHANNEL ENTER key 40 is pressed, this determination is based upon a comparison between the entered logical channel number and the maximum channel number per cable stored in the microcomputer's RAM 54 which represents those channels to which the subscriber is entitled to tune. If it is determined that the selected logical channel number is one to which the viewer is not entitled to tune, the program executes a channel number display clearing operation and exits the CATV channel tuning routine.

DISPLAY SELECTED CHANNEL NUMBER

Detection of a channel number entry causes appropriate output signals to be provided from microcomputer 26 to LED driver 64 for displaying the selected logical channel number on the LED display 66.

CONVERT LOGICAL CHANNEL NUMBER TO APPROPRIATE ADDRESS IN PROM

Following display of the selected logical channel number and activation of CHANNEL ENTER key 40, the microcomputer 26 then converts the logical channel number to an appropriate look-up table address in PROM 78. This conversion is performed in accordance with an operating routine stored in the microcomputer's ROM 52 which reads the selected logical channel number stored in RAM 54 and converts these numbers to a corresponding address which is accessed in PROM 78.

ENERGIZE THE PROM

The microcomputer then provides an appropriate output for initializing and applying power to PROM 78 in initiating the operation thereof. Thus, PROM operation is initiated only after the PROM 78 is accessed by microcomputer 26 in order to reduce power consumption in the present invention. The manner in which the initialize and power-up signals are provided from microcomputer 26 to PROM 78 for initiating the operation thereof is described in detail above.

READ CORRESPONDING PHYSICAL CHANNEL NUMBER AND CABLE DESIGNATION FROM PROM

After the appropriate address location in PROM 78 is accessed by microcomputer 26, the contents thereof are read from PROM 78 and provided to microcomputer 26. The PROM contents represent the cable designation and the physical, or standard, channel number which corresponds to the channel number utilized during the STANDARD mode of operation. As such, the physical channel number read by microcomputer 26 from PROM 78 has an associated carrier frequency to which the CATV channel assignment system must be tuned in order to receive this channel.

PROVIDE CABLE DESIGNATION SIGNAL TO CABLE SWITCH FOR CABLE SELECTION

Following receipt of the physical channel number by microcomputer 26, the appropriate cable designation signal is provided from microcomputer 26 via switching circuit 68 to the cable switch circuit 12 in order to select either cable A or cable B as determined by the first bit of the most significant digit of the physical channel number as described above. This switching function is performed automatically in response to the switch signal output from microcomputer 26 and insures that the proper cable is switched to in order to receive the selected channel number. In addition, this feature permits channels from either cable A or cable B to be included in the same group of channels to which the CATV channel assignment system may be tuned.

SEND SELECTED PHYSICAL CHANNEL REFERENCE CODE TO PLL

Following selection of the appropriate cable input, the microcomputer 26 synthesizes a reference code based upon the selected physical channel number received from the PROM 78 and provides this reference tuning code to PLL 74. This reference tuning code represents tuning data generated by information stored in the microcomputer's ROM 52 in accordance with the operating program in its ROM 52 for transfer to the PLL 74. This reference tuning code is used by PLL 74 to provide a correction voltage to the tuner/local oscillator 14 to change the local oscillator frequency until the frequencies of the local oscillator signal and a reference oscillator signal in PLL 74 are equal. The tuner/local oscillator 14 then assumes the stability of a crystal reference oscillator (not shown) within PLL 74 in providing a stable reference frequency for heterodyning with the received CATV RF signal in generating an IF signal which is provided to the IF stage 22.

SYNTHESIZE PLL TUNING CODE FOR TUNER/L.O.

With the proper cable selected and the appropriate reference tuning code provided to PLL 74 from microcomputer 26, PLL 74 outputs a correction signal to local oscillator 14 for generating the required reference frequency signal for tuning to the selected channel number. Included in tuner/local oscillator 14 is a mixer circuit which is not shown for simplicity's sake and in which the reference frequency signal and the received CATV RF signal are mixed for generating an IF signal which is output from the tuner/local oscillator 14 to the IF stage 22. Following this tuning operation, the program exists the CATV channel tuning routine.

There has thus been shown a channel tiering arrangement for a CATV system which permits selected channels to be grouped together as desired for selective viewing as in a restricted access CATV system. Virtually any combination of CATV channels may be included in a particular group of channels for viewing. The present invention makes use of a logical channel number which permits the channels within a group to be assigned logically related numbers. The logical channel number is converted to a physical channel number following channel number selection for generation of the appropriate tuning frequency signal. The physical channel number corresponds to the actual channel number, or that channel number used in conventional channel tuning. The system is controlled by a microcomputer which accesses a programmable read only memory device in which is stored physical channel number tuning data. The tuning system of the present invention is transparent to the user who need only enter logically related, easily remembered channel numbers of CATV channels arranged in associated channel groups.

While particular embodiments of the present invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A CATV tuning system for tuning to a plurality of CATV channels transmitted on at least one cable from a CATV head end with each of said CATV channels having a corresponding physical channel number related to an assigned carrier frequency of said CATV channel, said system comprising:

channel selector means responsive to user initiated inputs for generating a logical channel number representing a selected CATV channel;

memory means having a plurality of addressable storage locations in each of which is stored a physical channel number having an associated carrier frequency;

signal processing means coupled to said channel selector means and to said memory means and responsive to a logical channel number generated by said channel selector means for converting said logical channel number to a lock-up address in said memory means, the contents of the memory storage location defined by said look-up address representing a-predetermined physical channel number, for reading the contents of said given look-up address therefrom, and for converting the contents of said look-up address to a tuning frequency word associated with said physical channel number; and tuning circuitry coupled to said signal processing means and responsive to said tuning frequency word for tuning to the carrier frequency of said physical channel number.

2. A system as in claim 1 wherein said CATV channels are received on a plurality of cables with said system including automatic cable switching means coupled to said signal processing means and to said cables for automatically switching to the cable on which the selected CATV channel is provided in response to the entry of a logical channel number.

3. A system as in claim 1 further including mode switch means coupled to said signal processing means for switching said system to a first mode wherein said physical channel numbers are entered in said channel selector means or for switching said system to a second mode wherein said logical channel numbers are entered in said channel selector means in tuning to a desired CATV channel.

4. A system as in claim 1 further including channel number display means coupled to said signal processing means for displaying a selected channel number.

5. A system as in claim 1 wherein said CATV channels are received on a plurality of cables with said system further including manual switch means coupled to said signal processing means and responsive to user initiated input commands for switching said system to the cable on which a desired CATV channel is received.

6. A system as in claim 1 wherein said signal processing means includes a microcomputer and said memory means includes a programmable read only memory.

7. A system as in claim 1 further including means coupled to said signal processing means for energizing said memory means prior to the reading of the contents of a look-up address in said memory means by said signal processing means.

8. A system as in claim 1 wherein said look-up address representing a given physical channel number is provided to said signal processing means in the form of a multi-bit digital word and wherein one of said bits designates the cable on which a CATV channel corresponding to said physical channel number is received.

9. In a CATV tuning system wherein CATV channels are transmitted from a CATV head end on at least one cable with each CATV channel having associated therewith a physical channel number corresponding to an assigned carrier frequency, a method for tuning said CATV channels comprising:

assigning a logical channel number to each of the transmitted CATV channels;

storing each of said physical channel numbers in a respective addressable location of a memory device;

selecting a logical channel number representing a desired transmitted CATV channel for tuning;

converting the selected logical channel number to a given address of said memory device;

reading the physical channel number stored in the memory location of said memory device defined by said given address; and generating a tuning frequency corresponding to the physical channel number read from said memory device in tuning to the carrier frequency of the selected CATV channel.

10. A method as in claim 9 further comprising the step of automatically switching to the cable on which the selected CATV channel is received upon the selection of a logical channel number where said CATV channels are received on a plurality of cables.

11. A method as in claim 9 further comprising the step of displaying a selected logical channel number.

* * * * *